United States Patent
Chen et al.

(10) Patent No.: US 10,699,975 B2
(45) Date of Patent: Jun. 30, 2020

(54) SEMICONDUCTOR DEVICE

(71) Applicant: Winbond Electroics Corp., Taichung (TW)

(72) Inventors: Lun-Lun Chen, Taichung (TW);
Hsiu-Han Liao, Hsinchu (TW);
Yao-Ting Tsai, Kaohsiung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/171,028

(22) Filed: Oct. 25, 2018

(65) Prior Publication Data
US 2019/0221487 A1 Jul. 18, 2019

(30) Foreign Application Priority Data
Jan. 18, 2018 (CN) .......................... 2018 1 0047661

(51) Int. Cl.
| | |
|---|---|
| H01L 21/66 | (2006.01) |
| H01L 23/58 | (2006.01) |
| H01L 23/29 | (2006.01) |
| H01L 23/31 | (2006.01) |
| H01L 23/528 | (2006.01) |
| H01L 23/522 | (2006.01) |

(52) U.S. Cl.
CPC .............. *H01L 22/32* (2013.01); *H01L 22/34* (2013.01); *H01L 23/291* (2013.01); *H01L 23/3171* (2013.01); *H01L 23/528* (2013.01); *H01L 23/5226* (2013.01); *H01L 23/585* (2013.01)

(58) Field of Classification Search
CPC ............... H01L 23/291; H01L 23/3171; H01L 23/5226; H01L 23/528; H01L 23/585
See application file for complete search history.

(56) References Cited

U.S. PATENT DOCUMENTS

| | | | | |
|---|---|---|---|---|
| 2002/0024115 A1* | 2/2002 | Ibnabdeljalil | ......... | H01L 23/562 257/620 |
| 2004/0113190 A1* | 6/2004 | Oh | .................... | H01L 21/76801 257/296 |
| 2011/0291285 A1* | 12/2011 | Ueberreiter | ........... | H01L 23/528 257/773 |
| 2015/0214125 A1* | 7/2015 | Tang | ....................... | H01L 22/34 257/48 |
| 2019/0122982 A1* | 4/2019 | Hourani | ............ | H01L 21/76816 |

FOREIGN PATENT DOCUMENTS

| | | |
|---|---|---|
| CN | 101150094 B | 2/2011 |
| CN | 101286498 B | 4/2011 |
| TW | 201426839 A | 7/2014 |

* cited by examiner

*Primary Examiner* — Mark W Tornow
(74) *Attorney, Agent, or Firm* — Muncy, Geissler, Olds & Lowe, P.C.

(57) ABSTRACT

A semiconductor device having a conductive pad is provided, wherein the conductive pad includes a substrate, a dielectric layer, a plurality of vias, and a patterned conductive pad. The dielectric layer is overlying the substrate. The vias are disposed in the dielectric layer. The patterned conductive pad is disposed over the dielectric layer. The conductive pad includes, from a top view, at least three first conductive strips spaced apart from each other, arranged in different rows. The conductive strips in different rows are electrically and physically connected by a plurality of conductive strings. The conductive strings between different rows of the conductive strips are arranged in a staggered manner. The vias are disposed under the conductive strips.

15 Claims, 9 Drawing Sheets

SEMICONDUCTOR DEVICE

CROSS-REFERENCE TO RELATED APPLICATIONS

The present application claims priority of China Patent Application No. 201810047661.8 filed on Jan. 18, 2018, which is incorporated by reference herein in its entirety.

BACKGROUND OF THE INVENTION

Field of the Invention

The invention relates to a semiconductor device, and more particularly to a semiconductor device having a conductive pad.

Description of the Related Art

Integrated circuits (IC) are widely used in today's electronic devices, which include personal computers, cellphones, and digital cameras. The processes used to manufacture an IC may be mainly divided into three steps, including: (1) silicon wafer fabrication, (2) IC fabrication, and (3) IC packaging. During IC packaging, the wafer needs to be diced into smaller dies through scribe lines thereon, after which the subsequent packaging steps may proceed.

However, the time required for wafer dicing increases as the amount of dies increases. The dicing blades used in wafer dicing may easily become damaged by conventional conductive pads on the scribe lines. A damaged dicing blade is blunt, and therefore it can easily create cracks during dicing. This not only reduces the yield of the wafer dicing, but also the speed of wafer dicing. Unwanted chemical reactions may take place, and productivity may be reduced if the dicing time is too long. As a result, a semiconductor device which can enhance the speed and yield of wafer dicing is desired.

BRIEF SUMMARY OF THE INVENTION

The embodiments of the present disclosure include a semiconductor device having a conductive pad that includes a substrate, a dielectric layer, a plurality of vias, and a patterned conductive pad. The dielectric layer is overlying the substrate. The vias are disposed in the dielectric layer. The patterned conductive pad is disposed over the dielectric layer. The conductive pad includes, from a top view, at least three first conductive strips spaced apart from each other and arranged in different rows. The conductive strips in different rows are electrically and physically connected by a plurality of conductive strings. The conductive strings between the different rows of conductive strips are arranged in a staggered manner. The vias are disposed under the conductive strips.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF THE INVENTION

Figure 1:
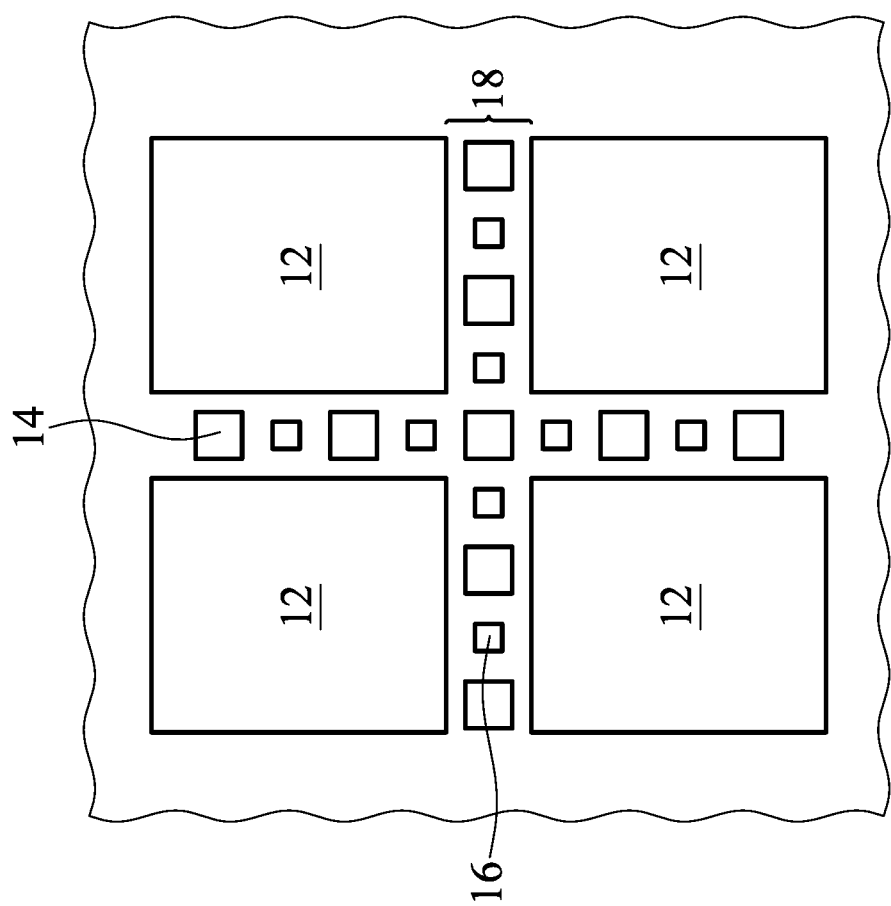
FIG. 1 is a top view of the semiconductor device having a conductive pad, according to some embodiments of the present invention.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

As shown in FIG. 1, a wafer 10 is provided, and a plurality of dies 12, conductive pads 14 and test keys 16 are defined thereon. In some embodiments, the conductive pads 14 and the test keys 16 are disposed alternatively in a scribe line 18 between the dies 12.

Conducting a wafer acceptance test (WAT) is a common way to test whether a wafer has any defects or not before wafer dicing can begin. During a WAT, a conductive pad 14 electrically connected to the test key 16 may be used to measure the electrical properties of the test key 16, and thus the stability of the semiconductor processes and the quality of wafer may be ensured. As a result, the yield may be improved.

Figure 2:
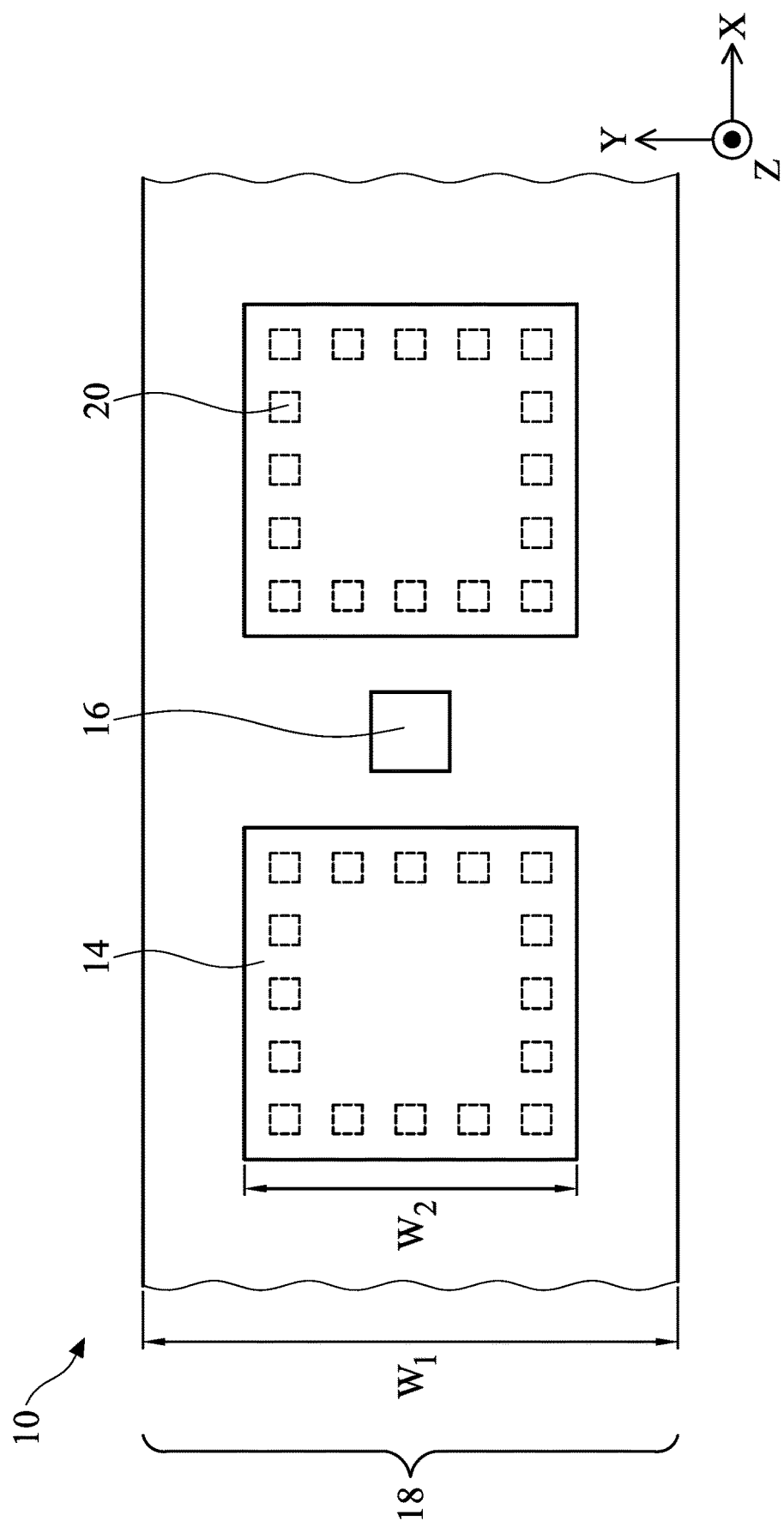
FIG. 2 is an enlarged view of the semiconductor device having a conductive pad, according to some embodiments of the present invention.

FIG. 2 is an enlarged view of the scribe line 18 in FIG. 1. The scribe line 18 has a width W1. The conductive pad 14 has a width W2 and has a plurality of vias 20 thereunder. The vias 20 are substantially disposed along the edges of the conductive pad 14 and are electrically and physically connected to the conductive pad 14.

In the embodiment in FIG. 2, the whole conductive pad 14 is formed from a whole piece of metal. As a result, when cracks form due to wafer dicing, the cracks tend to propagate along the same direction, and thus the cracks may easily propagate into the chip. Therefore, the structure of the chip may be damaged, resulting lower yield. Furthermore, a longer time is necessary for dicing the conductive pad 14 in present since metal has high ductility. Unwanted chemical reactions may occur if the dicing time is too long, especially when the dies have a lower dimension or the amount of dies becomes higher.

Figure 3:
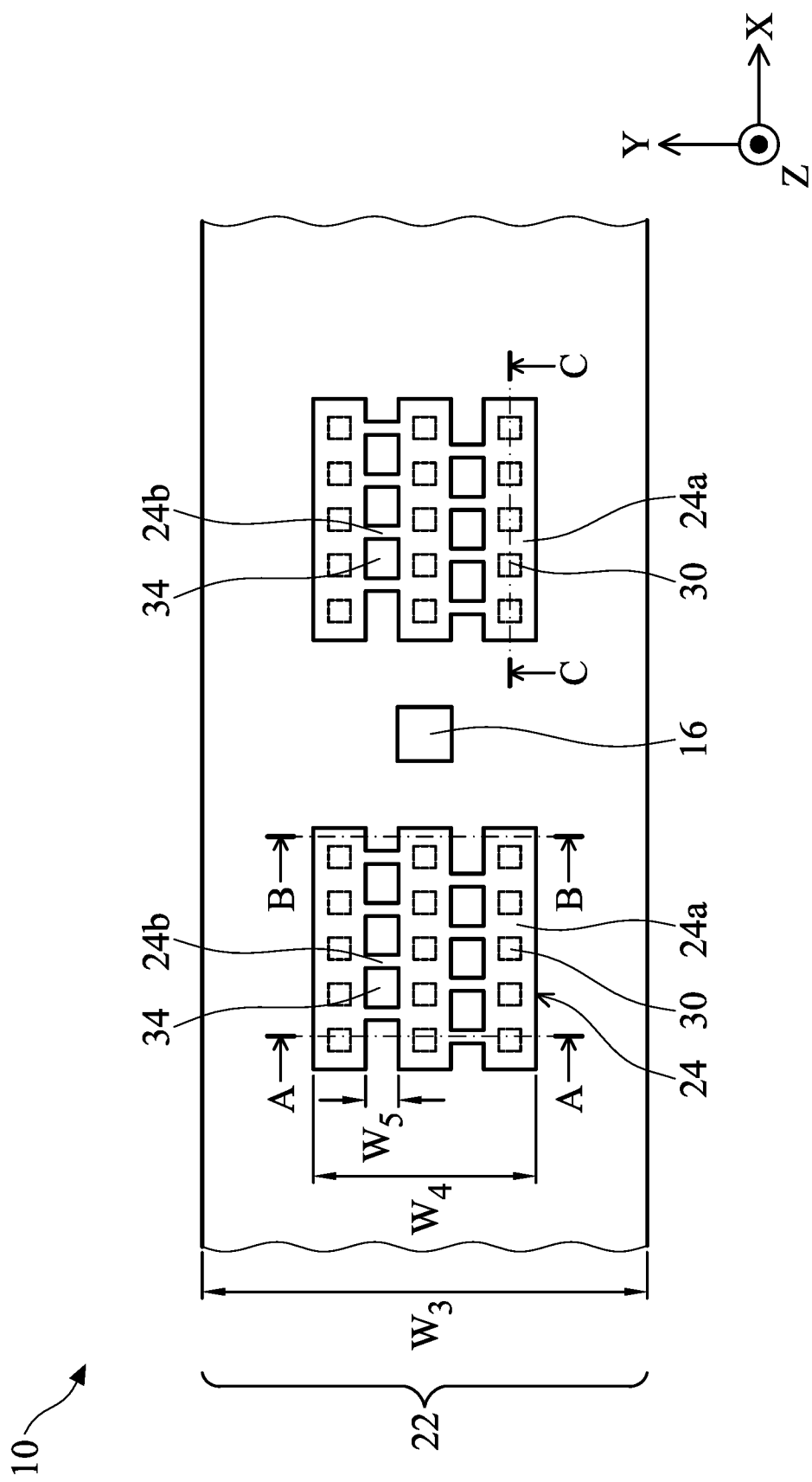
FIG. 3 is an enlarged view of the semiconductor device having a conductive pad, according to some embodiments of the present invention.

FIG. 3 is an enlarged view of a conductive pad, according to another embodiment of the present invention. A scribe line 22 has a test key 16 and conductive pads 24 thereon, wherein the scribe line 22 has a width W3, and the conductive pad 24 has a width W4. The difference between the conductive pad 14 in FIG. 2 and the conductive pad 24 is that the conductive pad 24 includes a plurality of first conductive strips 24a substantially extending along X direction and a plurality of first conductive strings 24b substantially extending along Y direction, wherein X direction is the direction of wafer dicing. Vias 30 are disposed under the first conductive strips 24a, and a plurality of vias 30 are disposed under a single first conductive strip 24a. However, no via is disposed under the first conducting string 24b. A dielectric material 34 is filled between the first conductive strips 24a and the first conductive strings 24b. It should be noted that the first conductive strings 24b between different first conductive strips 24a are arranged in a staggered manner. When comparing with the conductive pad 14, the propagating direction of the cracks caused by wafer dicing in the conductive pad 24 may be limited on X direction since the dielectric material 34 is filled in the conductive pad 24. As a result, the cracks have a lower chance to propagate into chips, and the wafer dicing time may be also effectively reduced.

In the embodiment of FIG. 3, the cracks causing by wafer dicing may tend to propagate along the dielectric material 34 which has a lower ductility, and the first conductive strings 24b between the first conductive strips 24a of the conductive pad 24 are arranged in a staggered manner, so the cracks created from wafer dicing may not tend to propagate toward the same direction. As a result, the structure of the conductive pad 24 in the present invention may prevent the cracks from directly propagating through the conductive pad 24 and entering the dies, so the yield of wafer dicing may be enhanced. Furthermore, the dielectric material 34 with a lower ductility is filled between the first conductive strips 24a and the first conductive strings 24b, the resistance of wafer dicing may be reduced, so the wafer dicing may become easier. Therefore, the speed of wafer dicing may be increased and the abrasion of wafer dicing blades may be mitigated, and thus the cost of manufacturing may be reduced.

Furthermore, this kind of structure prevents crack from propagating, no wider scribe line is required for preventing crack from propagating into the dies, so a width W4 of the conductive pad 24 may be reduced. As a result, a width W3 of the scribe line 22 may be reduced, with the lower width W4 of the conductive pad 24, to be lower than a width W1 of the scribe line 18. Therefore, available spaces on the wafer may be increased by the conductive pad 24.

It should be noted that the distance W5 between two adjacent first conductive strips 24a may be smaller than a diameter of a probe head for a WAT (not shown). For example, the distance W5 may be smaller than ⅓ to ½ of the diameter of the probe head, wherein the diameter of the probe head is between 10 μm and 20 μm. As a result, the probe head may be allowed to come into direct contact with the first conductive strips 24a, thereby ensuring the feasibility of the WAT.

The conductive pad 24 may be formed of conductive materials, such as Al, Cu, an alloy thereof, and the like. Patterned conductive pads 14 and 24 may be formed by using suitable masks (not shown) through lithography (e.g. exposure and development processes for the conductive material layer) and etching processes.

The dielectric material 34 may include one or more dielectric materials, such as silicon oxide, silicon nitride, silicon oxynitride, tetraethoxysilane, phosphosilicate glass (PSG), borophosphosilicate glass (BPSG), fluorosilicate glass (FSG), hydrogen silsesquioxane (HSQ) or other suitable dielectric materials.

Figure 4A:
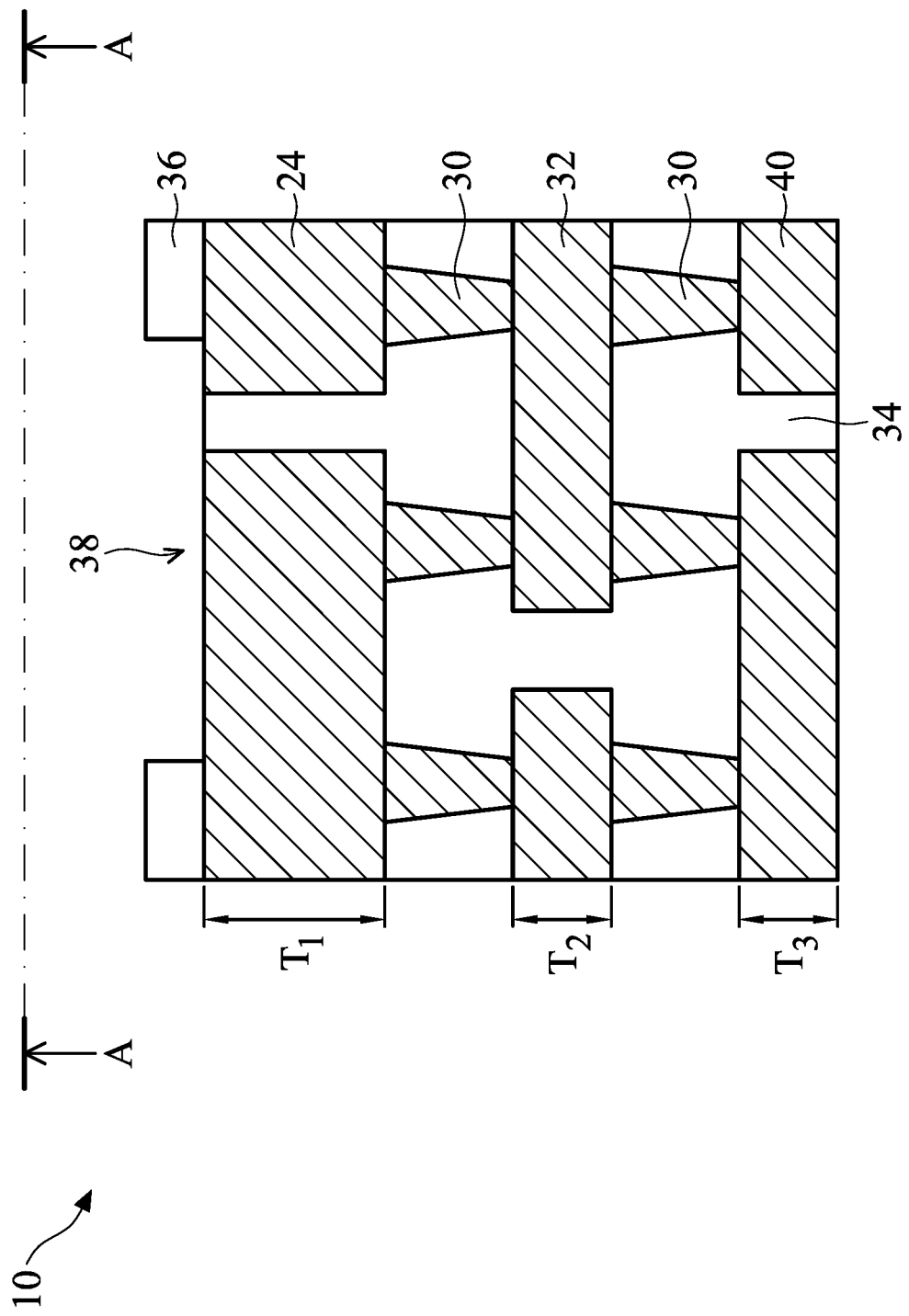
FIGS. 4A, 4B and 4C are cross-sectional views according to lines A-A, B-B, and C-C in FIG. 3, respectively.
Figure 4B:
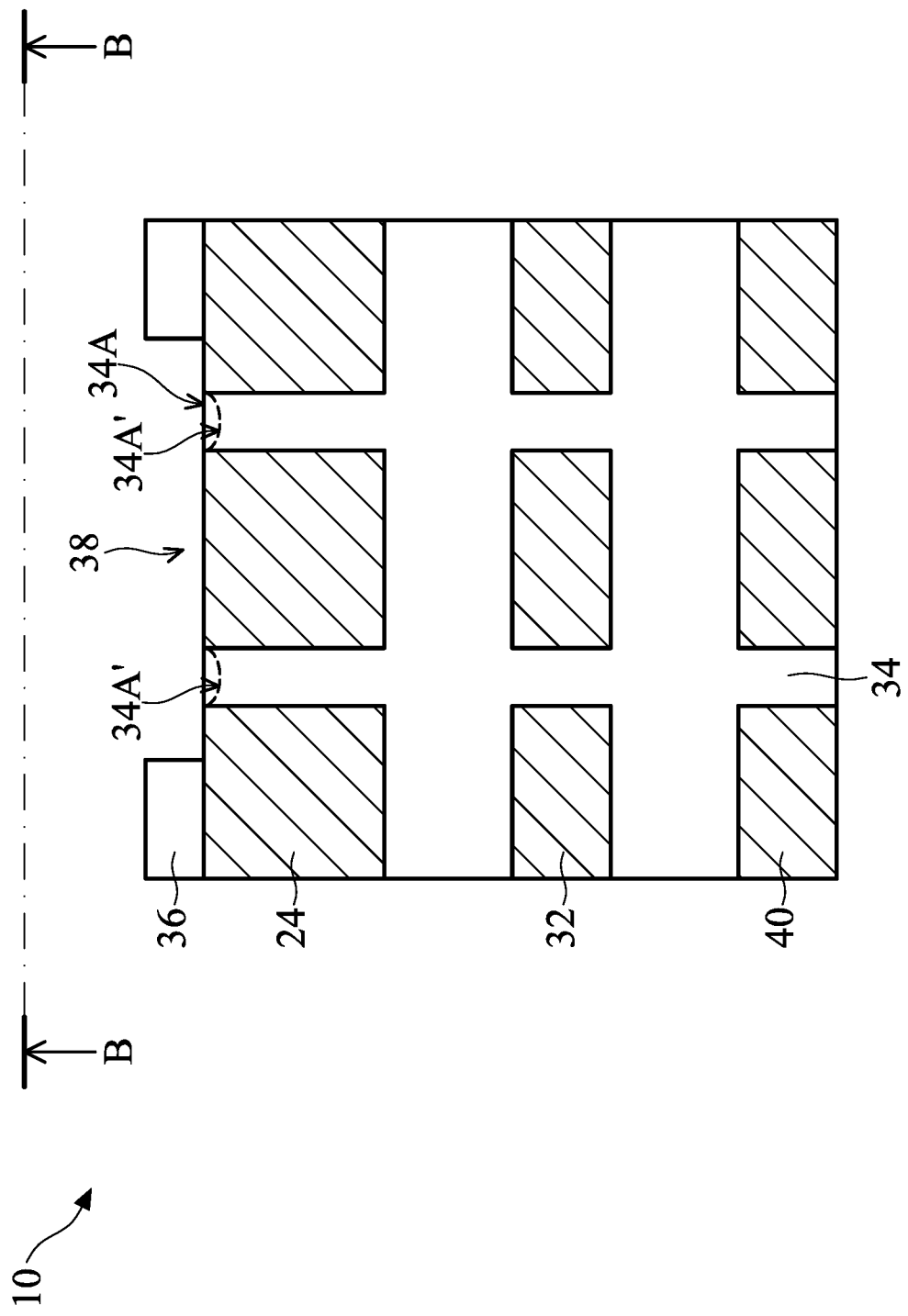
Figure 4C:
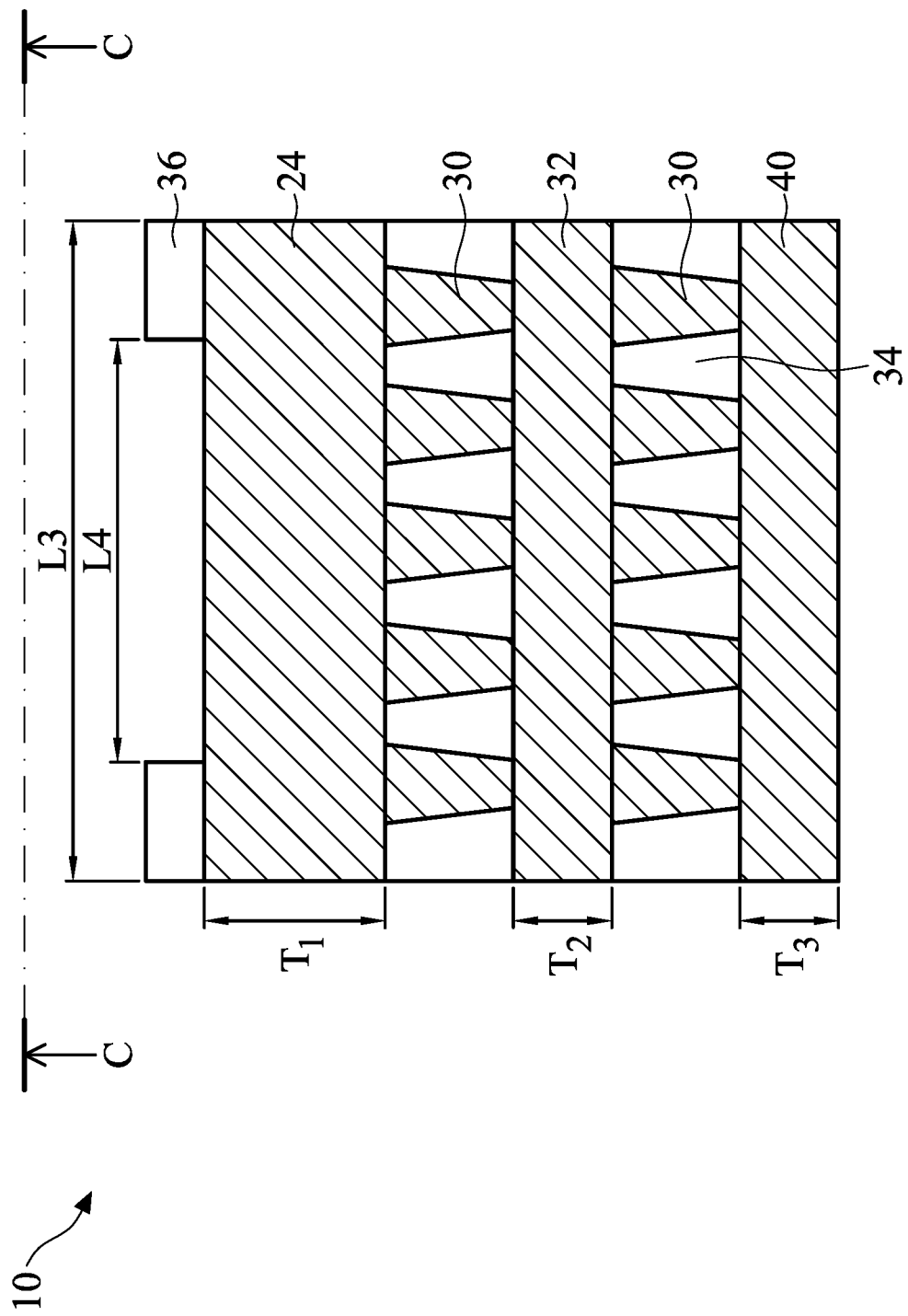

FIGS. 4A, 4B and 4C are cross-sectional views of the wafer 10 along lines A-A, B-B and C-C in FIG. 3, respectively. The conductive pad 24, a conductive layer 32 (first conductive layer) and a conductive layer 40 (second conductive layer) under the conductive pad 24, and the vias 30 electrically connect the conductive pad 24 and the conductive layers 32 and 40 are included in FIG. 4A, wherein the thickness T1 of the conductive pad 24 may be greater than the thickness T2 of the conductive layer 32, and the thickness T2 of the conductive layer 32 may substantially be the same as the thickness T3 of the conductive layer 40. For example, the thickness T1 may be in a range of about 800 nm to about 1000 nm, and the thickness T2 and T3 may be in a range of about 200 nm to about 300 nm. Depending on design requirements, the wafer 10 may include more than one conductive layer 32 and more than one conductive layer 40. The dielectric material 34 is also disposed between the conductive pad 24 and the conductive layers 32 and 40. A passivation layer 36 and an opening 38 are formed on the conductive pad 24.

As shown in FIGS. 4A and 4B, oxide, nitride, oxynitride and other suitable dielectric materials or a combination thereof may be deposited on the conductive pad 24, and the passivation layer 36 may be formed by, for example, lithography and etching processes, but the embodiments of the present invention are not limited thereto. As shown in FIG. 4A, the size of the passivation layer 36 is smaller than that of the conductive pad 24, so the conductive pad 24 may be exposed through the opening 38. As a result, the probe head may come into direct contact with the conductive pad 24 through the opening 38 to measure the electrical properties of the test key 16 during the WAT, and then the stability of the WAT may be improved.

As shown in FIG. 4B, the top surface of the dielectric material 34 may be a flat top surface 34A, but the present invention is not limited thereto. Depending on design requirements, the processes may be adjusted to allow the dielectric material 34 to have a concave top surface 34A' (as shown by the dashed line in FIG. 4B).

As shown in FIG. 4C, the conductive pad 24 has a length L3 in the X direction, and the area of the conductive pad 24 which is not covered by the passivation layer 36 (i.e. the area which contacts the probe head during the WAT) has a length L4, wherein the length L3 is between 50 μm and 70 μm, the length L4 is between 40 μm and 60 μm, and the ratio of the length L4 to the length L3 may be between about 0.9 to about 1.

The vias 30 and conductive layers 32 and 40 may be formed of conductive materials, such as Al, Cu, an alloy thereof, and so on, wherein the material of the conductive layers 32 and 40 may be different than the conductive pad 24, and the materials of the conductive layers 32 and 40 may be the same. A via opening (not shown) may be formed in the dielectric material 34 by a patterned mask layer (not shown) with one or more suitable processes, such as etching and lithography processes. Subsequently, the conductive layers 32 and 40 are formed on the dielectric material 34, and the via opening is filled to form the via 30. The via 30 and the conductive layers 32 and 40 may be formed using any suitable deposition process (e.g. chemical vapor deposition, physical vapor deposition, atomic layer deposition, etc.).

Figure 5A:
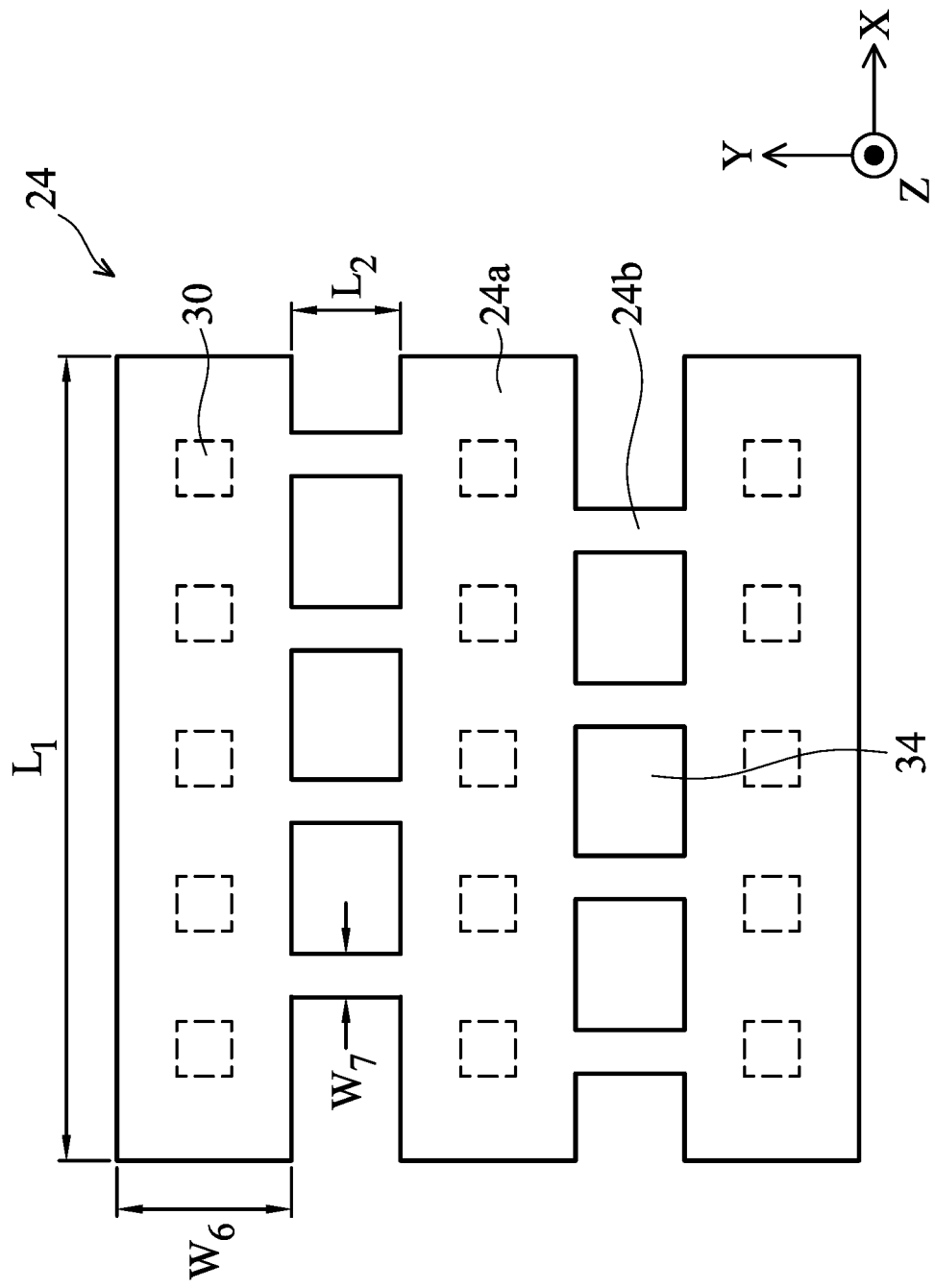
FIG. 5A is an enlarged view of the conductive pad in FIG. 3.
Figure 5B:
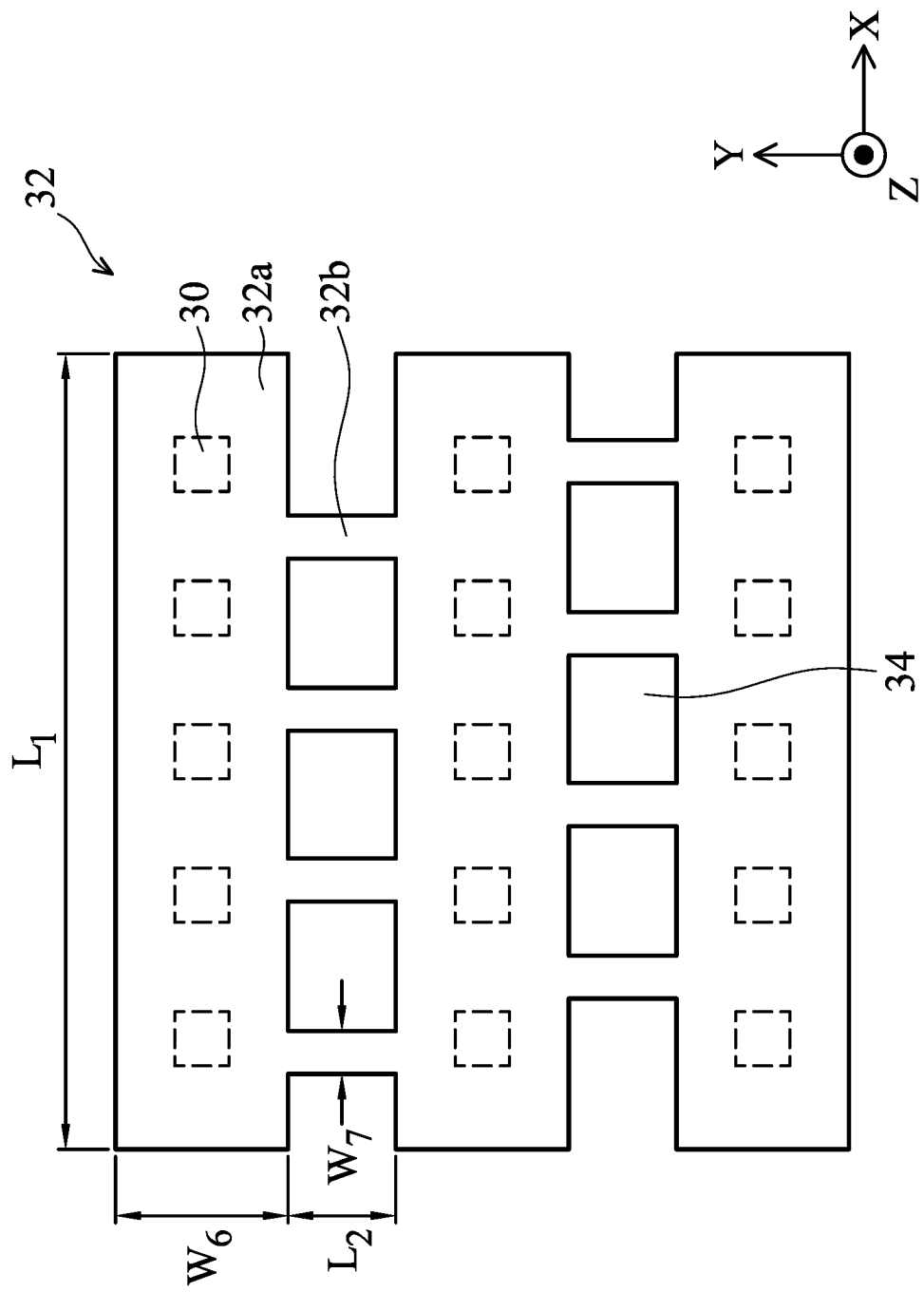
FIGS. 5B and 5C are top views of conductive lines under a conductive pad, according to some embodiments of the present invention.
Figure 5C:
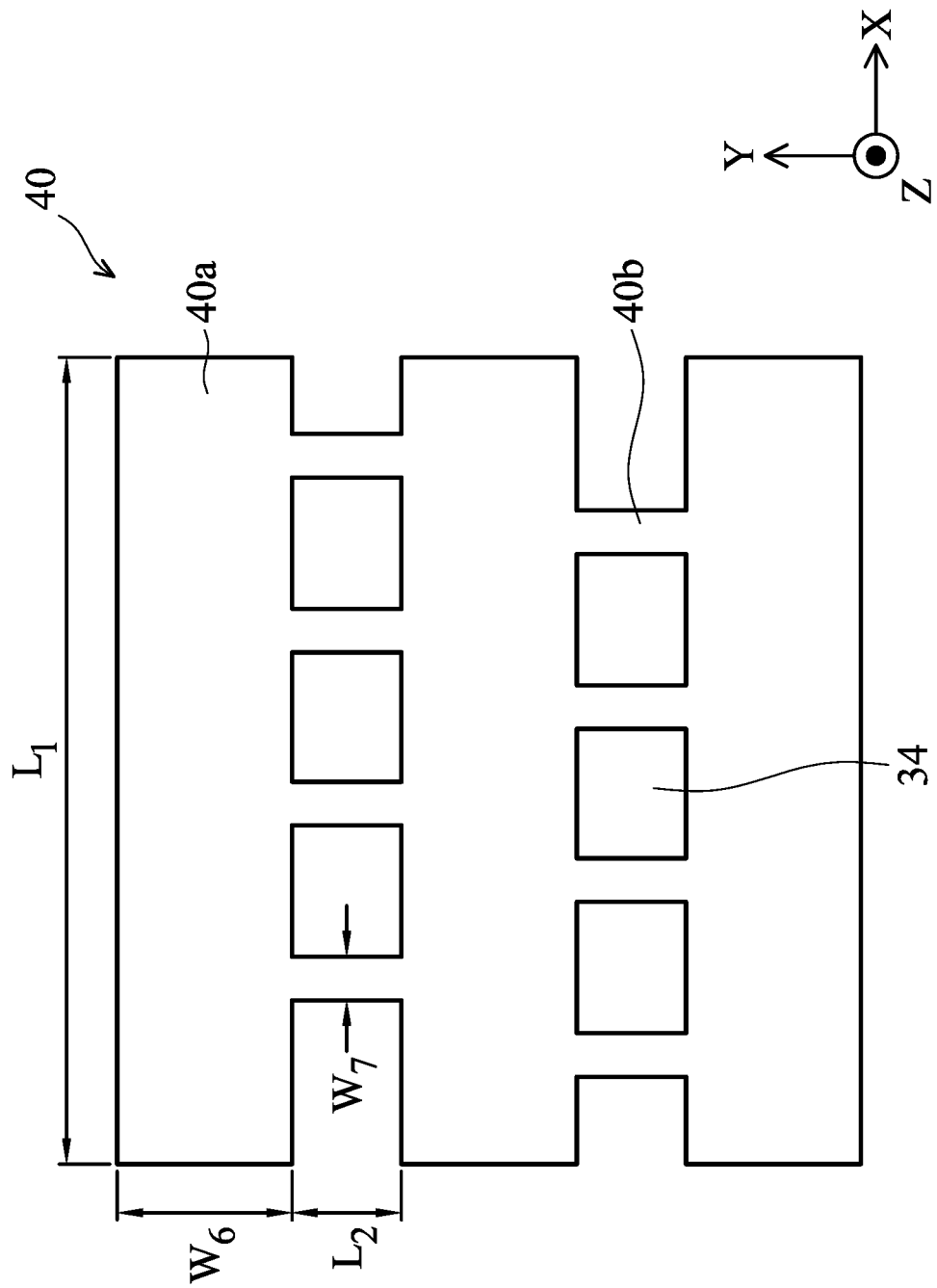

FIG. 5A is an enlarged view of the conductive pad 24 in FIG. 3. FIGS. 5B and 5C are top views of the conductive layer 32 and the conductive layer 40, respectively. In FIG. 5B, the conductive layer 32 includes three second conductive strips 32a, a plurality of second conductive strings 32b, and the dielectric material 34 disposed between the second conductive strips 32a and the second conductive strings 32b. In FIG. 5C, the conductive layer 40 includes three third conductive strips 40a, a plurality of third conductive strings 40b, and the dielectric material 34 disposed between the third conductive strips 40a and the third conductive strings 40b. A plurality of vias 30 are disposed below the conductive pad 24 and the conductive layer 32. The materials and processes of the second and third conductive strips 32a and 40a, the second and third conductive strings 32b and 40b and the dielectric material 34 are substantially the same as that of the first conductive strip 24a, the first conductive string 24b and the dielectric material 34, respectively.

The second and third conductive strips 32a and 40a have the same length L1 and the same width W6 as the first conductive strip 24a, and the second and third conductive strings 32b and 40b have the same length L2 and the same width W7 as the first conductive string 24b, wherein the width W6 is greater than the width W7, and the length L2 is equal to the distance W5 between two conductive strips. For example, the width W6 may be in a range of about 10 μm to about 15 μm, the width W7 may be in a range of about 0.5 μm to about 1 μm, and the ratio of the width W6 to the width W7 may be between about 10 to about 30. Furthermore, the width W6 of the first conductive strips 24a, the second conductive strips 32a and the third conductive strips 40a are substantially the same. As shown in FIG. 5B, the vias 30 are disposed below the second conductive strips 32a, and a plurality of vias 30 are disposed below a single second conductive strip 32a. Although no vias 30 are shown under the third conductive strips 40a, the present invention is not limited thereto. A plurality of vias 30 may also be disposed under a single third conductive strip 40a, depending on design requirements. The second and third conductive strips 32a and 40a extend in the X direction, the second and third conductive strings 32b and 40b substantially extend in the Y direction and are arranged in a staggered manner. In other words, the projections of the first, second and third conductive strips 24a, 32a and 40a on the wafer 10 substantially coincide with each other. The second conductive strings 32b and the third conductive strings 40b in different rows are arranged in a staggered manner, so the direction of a crack created during wafer dicing may be changed to prevent such cracks from directly propagating into the die, which may reduce the yield.

In some embodiments, the projections of the first, second and third conductive strips 24a, 32a and 40a on the wafer 10 (along the Z direction) substantially coincide with each other, the projections of the first and second conductive strings 24b and 32b on the wafer 10 are arranged in a staggered manner rather than coinciding with each other, and the projection of the first and third conductive strings 24b and 40b on the wafer 10 substantially coincide with each other, as shown in FIGS. 5A-5C. However, the present invention is not limited thereto. For example, the projections of the first and second conductive strings 24b and 32b on the wafer 10 may also be substantially coinciding with each other, or the projections of the first and the third conductive strings 24b and 40b on the wafer 10 may also be staggered. From a top view, the projections of the contours of the conductive pad 24 and the conductive layers 32 and 40 in the Z direction substantially coincide with each other.

The amount of conductive strips and conductive strings in FIGS. 5A-5C is exemplary rather than for limitation. For example, the conductive pad 24 may also have more than three first conductive strips 24a (such as four or five and so on) and more than four first conductive strings 24b (such as five or six and so on) in different rows, and the conductive pads 32 and 40 may also have more than three second conductive strips 32a and third conductive strips 40a (such as four or five and so on) and more than four second and third conductive strings 32b and 40b (such as five or six and so on), respectively. Furthermore, the amount of first, second and third conductive strings 24b, 32b and 40b may be different, depending on design requirements. In another embodiment, the patterned conductive layer 32 or 40 may also be substituted by a non-patterned conductive layer.

In summary, a semiconductor device having a conductive pad is provided in the embodiments of the present invention. The conductive pad may include three or more conductive strips and a plurality of conductive strings between the conductive strips, wherein the conductive strings in different rows are arranged in a staggered manner. The cracks created during wafer dicing may be prevented from propagating into the die by this method, and thus the yield of wafer dicing may be improved. Furthermore, a dielectric material with lower ductility is filled between the conductive strips, so the difficulty of wafer dicing is decreased, and thus the speed of wafer dicing is increased and its cost is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a dielectric layer overlying the substrate;
   a conductive pad over the dielectric layer, including, in a top view:
   at least three first conductive strips spaced apart from each other, arranged in different rows, wherein the first conductive strips of different rows are electrically and physically connected by a plurality of first conductive strings, and the first conductive strings between different rows of the first conductive strips are arranged in a staggered manner, wherein each of the first conductive strips has a constant width over an entire length of the first conductive strip, and the length is greater than the width; and
   a plurality of vias in the dielectric layer, wherein the vias are disposed under the first conductive strips.

2. The semiconductor device as claimed in claim 1, wherein the conductive pad is disposed above a scribe line of the substrate.

3. The semiconductor device as claimed in claim 1, wherein a width of the first conductive strips is greater than a width of the first conductive strings.

4. The semiconductor device as claimed in claim 1, wherein the first conductive strips extend in a first direction, the first conductive strings extend in a second direction, and the first direction is substantially perpendicular to the second direction.

5. The semiconductor device as claimed in claim 1, wherein there is a dielectric material between the first conductive strips and the first conductive strings.

6. The semiconductor device as claimed in claim 1, wherein a width of the first conductive strips is between 10 µm to 15 µm, and a width of the first conductive strings is between 0.5 µm to 1 µm.

7. The semiconductor device as claimed in claim 1, wherein the conductive pad is formed of from three to five first conductive strips and four to six first conductive strings.

8. The semiconductor device as claimed in claim 1, further comprising a passivation layer disposed over the conductive pad, and a material of the passivation layer comprises oxide, nitride, or a combination thereof.

9. The semiconductor device as claimed in claim 1, wherein the vias are not disposed under the first conductive strings.

10. The semiconductor device as claimed in claim 1, further comprising a first conductive layer below the vias, wherein the first conductive layer comprises, in a top view:

at least three second conductive strips spaced apart from each other and arranged on different rows, wherein the second conductive strips are electrically and physically connected through a plurality of second conductive strings, and the second conductive strings between different rows are arranged in a staggered manner.

11. The semiconductor device as claimed in claim 10, wherein a projection of the first conductive strips on the substrate substantially coincides with a projection of the second conductive strips on the substrate, and a projection of the first conductive strings on the substrate does not coincide with a projection of the second conductive strings on the substrate.

12. The semiconductor device as claimed in claim 10, wherein a thickness of the conductive pad is greater than a thickness of the first conductive layer.

13. The semiconductor device as claimed in claim 10, further comprising a second conductive layer under the first conductive layer, wherein four sides of the second conductive layer are substantially aligned with four sides of the first conductive layer.

14. The semiconductor device as claimed in claim 2, wherein a width of the scribe line is greater than a width of the conductive pad.

15. The semiconductor device as claimed in claim 1, wherein each of the first conductive strips is directly connected to more than one first conductive strings at an identical side of the first conductive strip.

* * * * *